(12) United States Patent
Shinozaki et al.

(10) Patent No.: US 7,969,816 B2
(45) Date of Patent: Jun. 28, 2011

(54) MEMORY DEVICE

(75) Inventors: Naoharu Shinozaki, Tokyo (JP);
Satoshi Moue, Kawasaki (JP)

(73) Assignee: Spansion LLC, Sunnyvale, CA (US)

( * ) Notice: Subject to any disclaimer, the term of this patent is extended or adjusted under 35 U.S.C. 154(b) by 143 days.

(21) Appl. No.: 12/548,034

(22) Filed: Aug. 26, 2009

(65) Prior Publication Data

US 2011/0051529 A1 Mar. 3, 2011

(51) Int. Cl.
*G11C 8/16* (2006.01)
(52) U.S. Cl. ............ 365/233.13; 365/233.1; 365/189.05
(58) Field of Classification Search ............. 365/233.13, 365/233.1, 189.05
See application file for complete search history.

(56) References Cited

U.S. PATENT DOCUMENTS 6,166,990 A * 12/2000 Ooishi et al. ............. 365/233.11

FOREIGN PATENT DOCUMENTS

| JP | 2001126474 A | 5/2001 |
| JP | 2001189077 A | 7/2001 |
| JP | 2005182904 A | 7/2005 |

* cited by examiner

*Primary Examiner* — Huan Hoang
(74) *Attorney, Agent, or Firm* — Frommer Lawrence & Haug LLP; Matthew M. Gaffney

(57) ABSTRACT

Systems and methods for reading data from or writing data to a memory device. The methods involve receiving a first pulse signal having a first pulse frequency at the memory device. The methods also involve generating, at the memory device, a second pulse signal using the first pulse signal. The second pulse signal is a compliment of the first pulse signal. The second pulse signal has a second pulse frequency that is equal to the first frequency. The fist pulse signal is used to control first read/write operations so that first data is output from or input to the memory device at a first data rate. The first and second pulse signals are used to control second read/write operations so that second data is output from or input to the memory device at a second data rate. The second data rate is twice the first data rate.

20 Claims, 14 Drawing Sheets

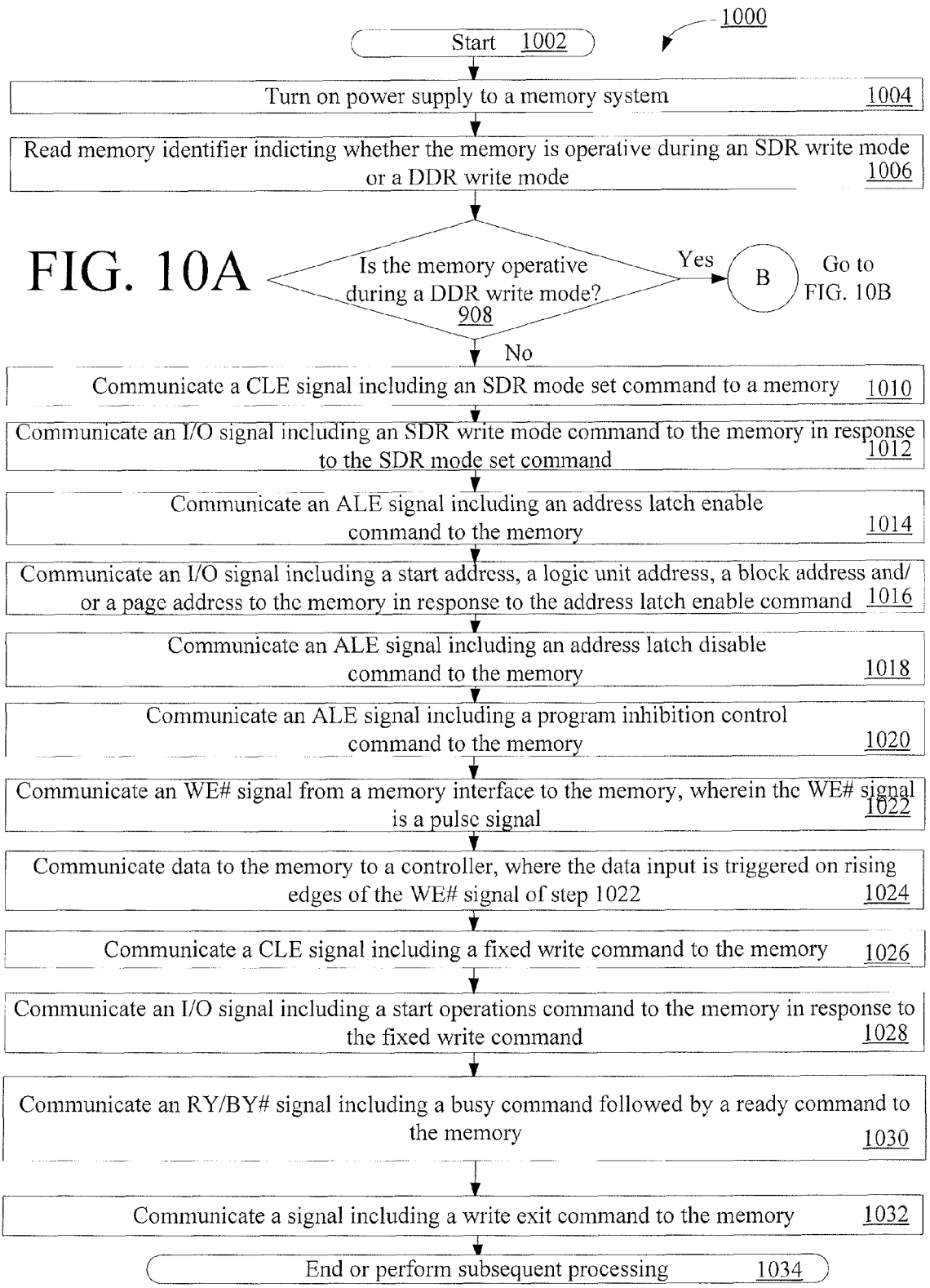

MEMORY DEVICE

BACKGROUND OF THE INVENTION

1. Statement of the Technical Field

The invention concerns memory devices. More particularly, the invention concerns systems and methods for interfacing a memory device.

2. Description of the Related Art

Conventional memory systems typically comprise a central processing unit, a memory controller, and a plurality of memory devices. The memory devices can include, but are not limited to, a Dynamic Random Access Memory (DRAM), a Static Random Access Memory (SRAM) and a flash memory. Flash memory can be a solid state storage device of a NAND type or a solid state storage device of a NOR type. The memory controller typically includes an interface for each type of memory device. For example, the memory controller can include a DRAM interface, an SRAM interface and a NAND type flash memory interface.

BRIEF DESCRIPTION OF THE DRAWINGS

Embodiments will be described with reference to the following drawing figures, in which like numerals represent like items throughout the figures, and in which:

FIGS. 10A-10B collectively provide a flow diagram of a method for interfacing a memory device operative in an SDR write mode and/or a DDR write mode according to an embodiment of the present invention.

DETAILED DESCRIPTION

Figure 1:
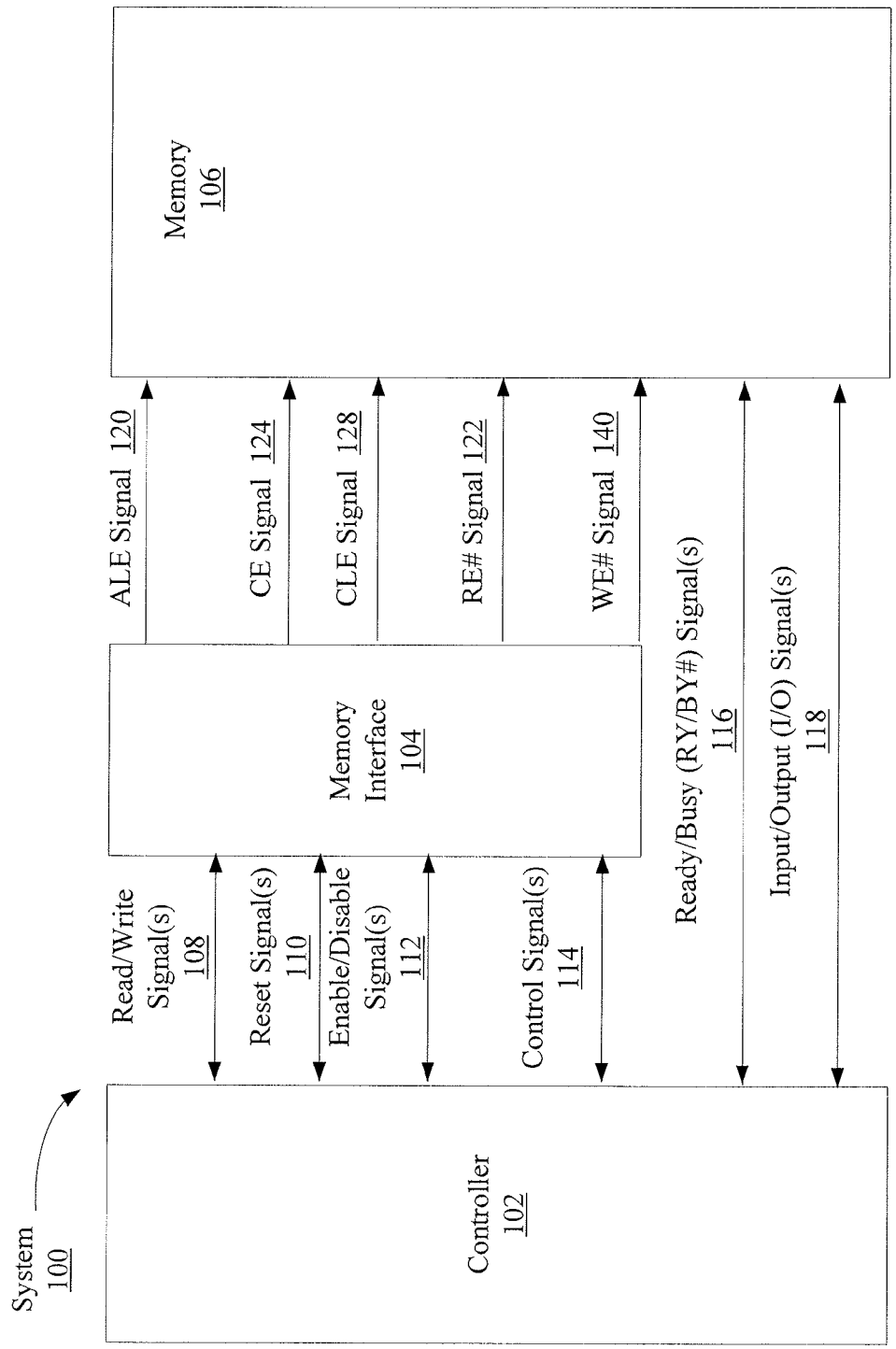
FIG. 1 is a block diagram of an exemplary system that is useful for understanding the present invention.

The present invention is described with reference to the attached figures, wherein like reference numbers are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is if, X employs A; X employs B; or X employs both A and B, then "X employs A or B" is satisfied under any of the foregoing instances.

Briefly stated, embodiments of the present invention are related to systems and methods for managing a plurality of memory device using a common interface. Embodiments of the present invention facilitate the miniaturization of memory systems including a central processing unit, a memory controller and memory. The memory includes a plurality of data stores, such as an SDR Random Access Memory (RAM) and a DDR RAM. The system embodiments of the present invention are configured to generate a complementary clock signal (also referred to herein as a "complimentary Read Enable (RE) signal" or a "complimentary Write Enable (WE) signal") when the memory is in a DDR read or write mode. The complimentary clock signal is used to control data input or output of the memory when it is in its DDR read mode or DDR write mode. For example, the data output is triggered on the falling edges of pulses of an RE# signal when the memory is in an SDR read mode. The data output is triggered on the falling edges of pulses of the RE# signal and the complimentary RE signal when the memory is in a DDR read mode. The data input is triggered on the rising edges of pulses of a WE# signal when the memory is in an SDR write mode. The data input is triggered on the rising edges of pulses of the WE# signal and the complimentary WE signal when the memory is in an SDR write mode. System embodiments of the present invention will be described in detail below in relation to FIGS. 1-8. The method embodiments of the present invention will be described below in relation to FIGS. 9A-10B.

Notably, the present invention provides a differential interface without increasing the number of input terminals of the memory and memory controller. The differential interface facilitates high speed of read and write operations performed by the system. Also, the modification of the memory and memory controller is relatively small as a result of the utilization of existing input terminals. Furthermore, the present invention is not limited to flash memory applications. As such, the present invention can be applied to the next generation memory applications, such as Phase Change Memory (PCM) applications and Resistive Random Access Memory (ReRAM) applications.

Referring now to FIG. 1, there is provided a block diagram of an exemplary system 100 that is useful for understanding the present invention. As shown in FIG. 1, the system 100 comprises a controller 102, a memory interface 104 and a memory 106. The controller 102 is generally configured for controlling the operations of the memory 106. In this regard, the controller 102 is electrically connected to the memory 106 via the memory interface 104. The controller 102 communicates read/write signals 108, reset signals 110, enable/disable signals 112 and other control signals 114 to and from the memory interface 104. The controller 102 is also configured to communicate control signals to and from the memory 106. The controls signals include, but are not limited to, Ready/Busy (RY/BY#) signals 116 and Input/Output (I/O) signals 118. The control signals 116, 118 will be described below.

The memory interface 104 is electrically connected to the memory 106. The interface 104 provides a common interface between the controller 102 and memory 106. In this regard, the interface 104 communicates command signals to the memory 106. Such command signals include, but are not limited to, an Address Latch Enable (ALE) signal 120, an RE signal# 122, a Chip Enable (CE) signal 124, a WE# signal 140 and a Command Latch Enable (CLE) signal 128. Each of these command signals 120, 122, 124, 126, 128 will be described below.

The memory interface 104 communicates the RE# signal 122 and/or the WE signal 140 to the memory 106 based on the type of operation to be performed thereby. For example, the RE signal 122 is communicated from the memory interface 104 to the memory 106 when an SDR or DDR read operation is to be performed by the memory 106. The WE signal 140 is communicated from the memory interface 104 to the memory 106 when an SDR or DDR write operation is to be performed by the memory 106. At the memory 106, a complimentary RE# signal (not shown) is generated when a DDR read operation is to be performed thereby. Similarly, a complimentary WE# signal (not shown) is generated by memory 106 when a DDR write operation is to be performed thereby. The memory 106 will now be described in detail in relation to FIGS. 2A-2E.

Figure 2A:
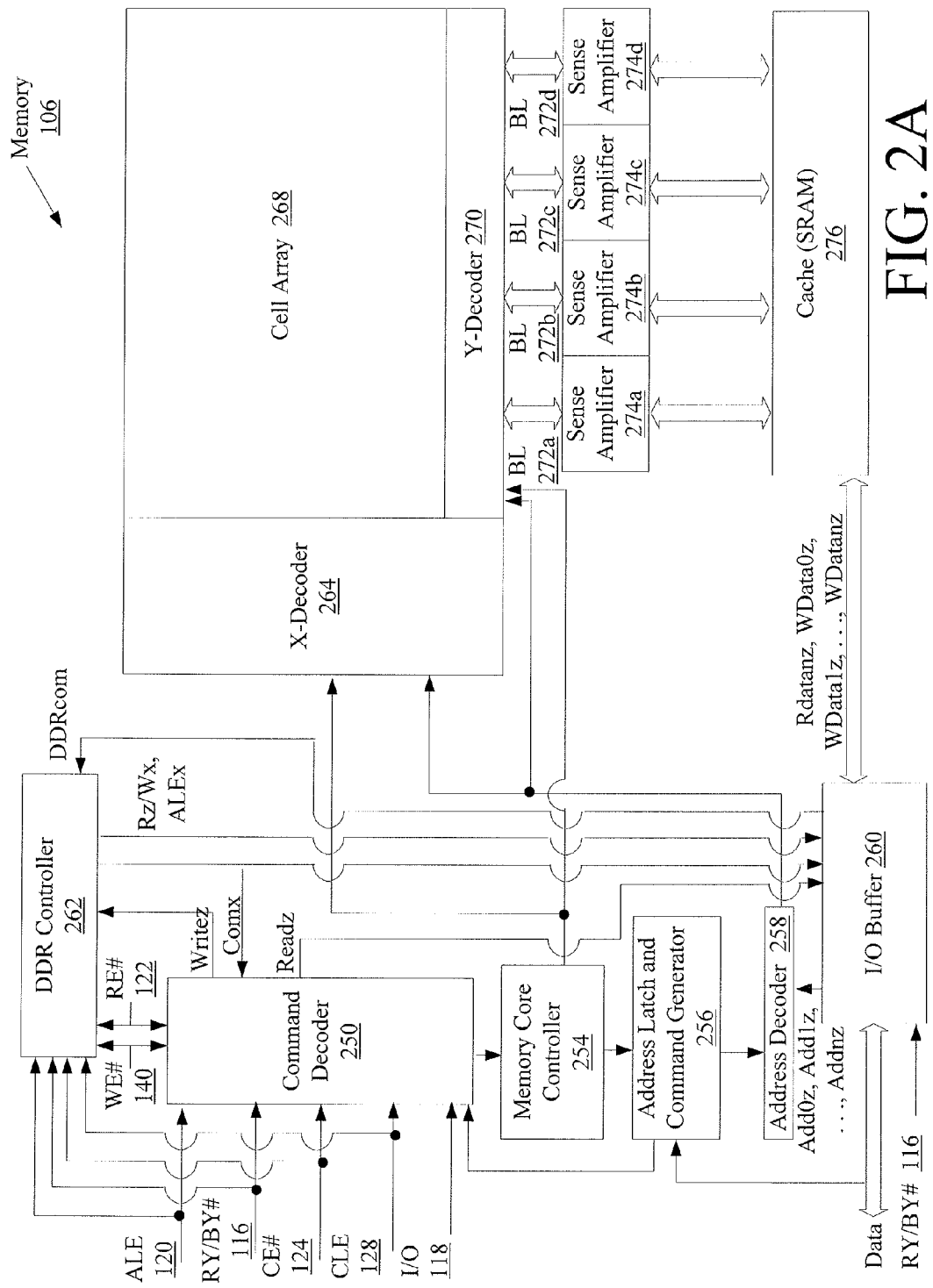
FIG. 2A is a block diagram of the NAND Flash Memory that is useful for understanding the present invention.
Figure 2B:
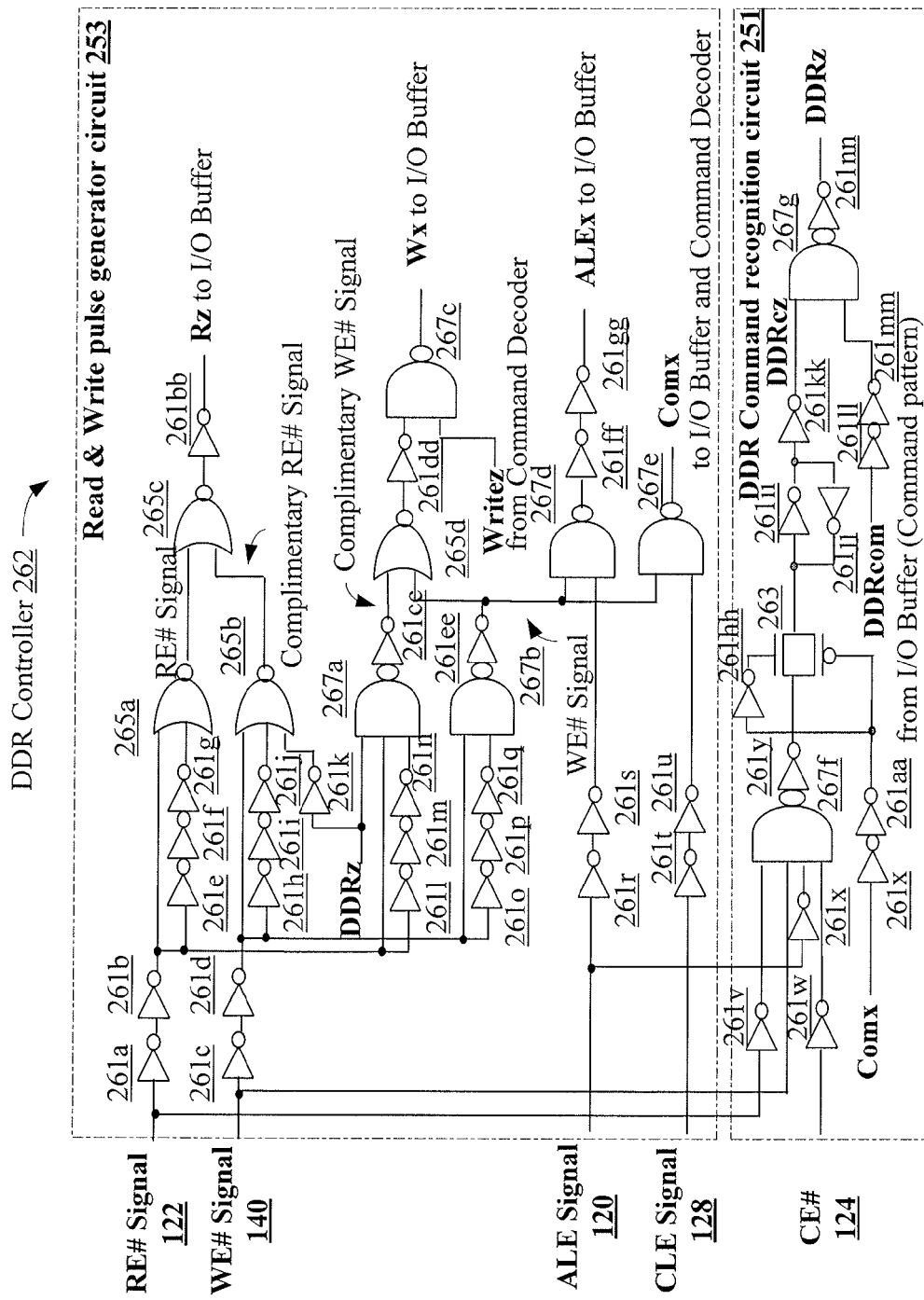
FIG. 2B is a block diagram of an exemplary embodiment of the DDR controller shown in FIG. 2A that is useful for understanding the present invention.

Referring now to FIG. 2A, there is provided a block diagram of an exemplary embodiment of the memory 106 shown in FIG. 1. As shown in FIG. 2A, the memory 106 comprises a command decoder 250, a memory core controller 254, a DDR controller 262, an Address Latch and Command Generator (AL/CG) 256, an address decoder 258, an Input/Output (I/O) buffer 260, a cache (SRAM) 276, at least one sense amplifier 274a, 274b, 274c, 274d, a Y-decoder 270, an X-decoder 264 and at least one cell array 268. The cell array 268 can be configured to store at least one page (not shown) of data (e.g., two thousand forty eight (2048) bytes of data). An exemplary memory organization for the cell array 268 will be described below in relation to FIG. 3. However, it should be understood that the cell array 268 comprises a plurality of unit cells (e.g., unit cells $402_1$, $402_2$, ..., $402_g$, $402_{g+1}$, $402_{g+2}$, ..., $402_G$ shown in FIG. 4) for storage of data. Each unit cell (e.g., unit cells $402_1$, $402_2$, ..., $402_g$, $402_{g+1}$, $402_{g+2}$, ..., $402_G$ shown in FIG. 4) is configured to store one (1) bit of data.

The command decoder 250 receives command signals from external command generating devices (not shown in FIG. 2A). Such command signals include, but are not limited to, the ALE signal 120, the RY/BY# signal 116, the CE# signal 124, the CLE signal 128, the I/O signal 118, the WE# signal 140 and the RE# signal 122. The ALE signal 120 controls writing to the address latch 256 in all operational modes of the memory 106. The operational modes include, but are not limited to, an SDR read mode, a DDR read mode, an SDR write mode and a DDR write mode. When the ALE signal 120 is high, the address is loaded on the falling edge of the WE# signal 140. The ALE signal 120 remains high during an entire address sequence.

When the memory 106 is in an SDR or DDR read mode, the RE# signal 122 is used to control a data output of the memory 106. In this regard, it should be noted that the DDR controller 262 generates a complimentary RE# signal (not shown in FIG. 2A) when it is in its DDR read mode. The RE# signal 122 and the complimentary RE# signal (not shown in FIG. 2A) are used by the DDR controller 262 to control the data output of the memory device 106. The data output is triggered on the falling edges of pulses of the RE# signal and the falling edge of the complimentary RE# signal (not shown in FIG. 2A) when the memory 106 is in its DDR read mode. In contrast, the data output is triggered only on the falling edges of pulses of the RE# signal when the memory 106 is in its SDR read mode.

The CE# signal 124 controls the operational mode of the memory 106. During a command or address load sequence, the CE# signal 124 is low prior to the falling edge of the WE# signal 140. The WE# signal 140 controls the data input and command of the I/O signal 118 during a write sequence (i.e., when the memory 106 is in its SDR write mode or DDR write mode). In this regard, it should be noted that the DDR controller 262 generates a complimentary WE# signal (not shown in FIG. 2A) when it is in its DDR write mode. The complimentary WE# signal (not shown in FIG. 2A) is used by the DDR controller 262 to control data input. The data input is triggered on the rising edges of pulses of the WE# signal 140 and the rising edges of pulses of the complimentary WE# signal (not shown in FIG. 2A) when the memory 106 is in its DDR write mode. In contrast, the data input is triggered only on the rising edges of pulses of the WE# signal 140 when the memory 106 is in its SDR write mode.

The CLE signal 128 controls writing to the command register (not shown in FIG. 2A). When the CLE signal 128 is high, the command is loaded into the memory 106 on the falling edge of a pulse of the WE# signal 140. The I/O signal 118 includes command information, address information and data communicated to and from the command decoder 250. The RY/BY# signal 116 indicates the operation status of the memory 106. When the RY/BY# signal 116 is high, the memory 106 is performing an operation such as an SDR read mode operation, an SDR write mode operation, a DDR read mode operation, a DDR write mode operation or other memory related operation.

As shown in FIG. 2A, the command decoder 250 is communicatively coupled to the DDR controller 262, the memory core controller 254 and the I/O buffer 260. The command decoder 250 communicates commands to the DDR controller 262, the memory core controller 254 and the I/O buffer 260 for controlling the operations thereof.

Figure 2C:
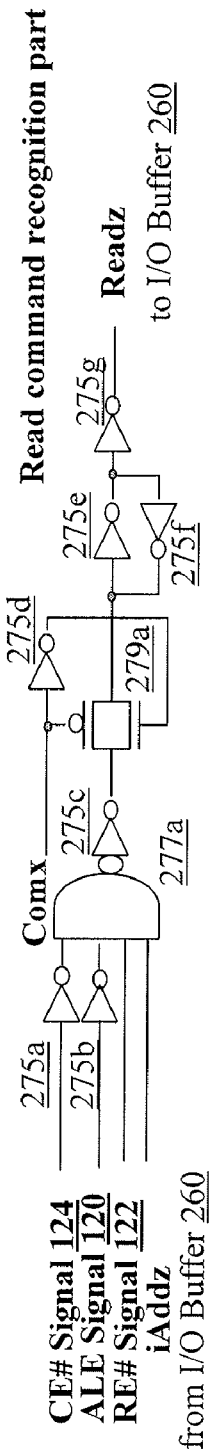
FIG. 2C is a block diagram of an exemplary embodiment of the command decoder shown in FIG. 2A that is useful for understanding the present invention.
Figure 2C:
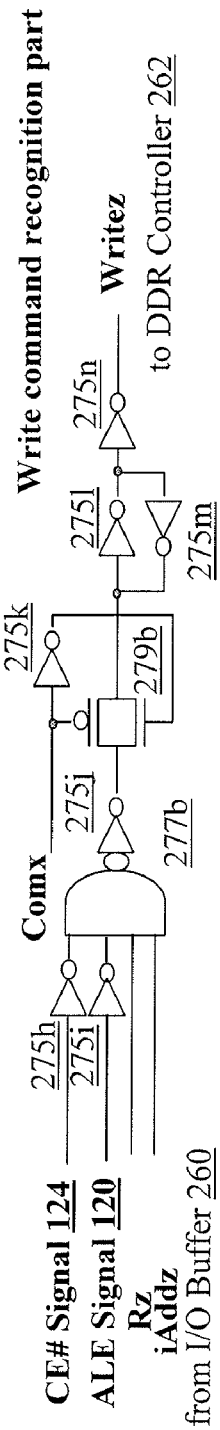

An exemplary embodiment of the command decoder 250 is provided in FIGS. 2C. As shown in FIG. 2C, the command decoder 250 includes a plurality of logic devices and switches 279a, 279b. The logic devices include, but are not limited to, NOT devices 275a, 275b, ..., 275n and NAND devices 277a, 277b. An address signal iAddz is generated by the command decoder 250 when a read and/or write command is received thereat via the I/O signal 118. For example, a read command can be defined as "00h". A write command can be defined as "80h". The command decoder 250 also generates the command signal Readz and communicates the same to the I/O buffer 260 when the read command is received thereat. Similarly, the command decoder 250 generates the command signal Writez and communicates the same to the DDR controller 262 when the write command is received thereat. Embodiments of the present invention are not limited in this regard.

Referring again to FIG. 2A, the DDR controller 262 places the memory 106 in a DDR operation mode based on the voltage levels of the input signal(s) 122, 140 received thereat. An exemplary embodiment of the DDR controller 262 is provided in FIG. 2A. As shown in FIG. 2A, the DDR controller 262 includes a plurality of logic devices and a switch 263. The logic devices include, but are not limited to, NOT devices $261a, 261b, \ldots, 261z, 261aa, 261bb, \ldots, 261nn$, NAND devices $267a, 267b, \ldots, 267g$ and NOR devices $265a, 265b, 265c, 265d$. The DDR controller 262 is generally configured to generate at least one command signal Rz, Wx, ALEx and/or DDRz based on the voltage values of at least one input signal 120, 122, 124, 128, 140 received from an external device (not shown in FIG. 2B), a command signal Writez received from the command decoder 250 and/or a command signal DDRcom received from the I/O buffer 260. For example, if the RE# signal 122 and the WE# signal 140 change from a high signal voltage level to a low signal voltage level at the same time, then a DDR command recognition circuit 251 of the DDR controller 262 recognizes that it should be transitioned into its DDR mode. As a result of said recognition, the DDR controller 262 transitions into its DDR mode. In its DDR mode, the DDR controller 262 generates a command signal DDRz. In response to the command signal DDRz, a read & write pulse generator circuit 253 of the DDR controller 262 generates a command signal Rz or Wx having a pulse repetition rate suitable for enabling DDR read and/or write operations. Embodiments of the present invention are not limited in this regard.

Referring again to FIG. 2A, the memory core controller 254 generally controls the operations of the Y-decoder 270 and the X-decoder 264. The Y-decoder 270 and the X-decoder 264 are communicatively coupled to the cell array 268. Each of the decoders 270, 264 is configured to select unit cells (e.g., unit cells $402_1, 402_2, \ldots, 402_g, 402_{g+1}, 402_{g+2}, \ldots, 402_G$ shown in FIG. 4) for the storage of data. The Y-decoder 270 is communicatively coupled to the one or more sense amplifiers $274a, 274b, 274c, 274d$ via bit lines $272a, 272b, 272c, 272d$. Each sense amplifier $274a, 274b, 274c, 274d$ is an electronic amplifier circuit configured to sense (or read) and refresh (or program) the value of a bit stored in a unit cell (e.g., unit cells $402_1, 402_2, \ldots, 402_g, 402_{g+1}, 402_{g+2}, \ldots, 402_G$ shown in FIG. 4). The sense amplifiers $274a, 274b, 274c, 274d$ are communicatively coupled to the cache 276. The cache 276 is configured to receive data to be programmed (or written) to the cell array 268 from the I/O buffer 260. The cache 276 is also configured to communicate data read from the cell array 268 to the I/O buffer 260.

Figure 2D:
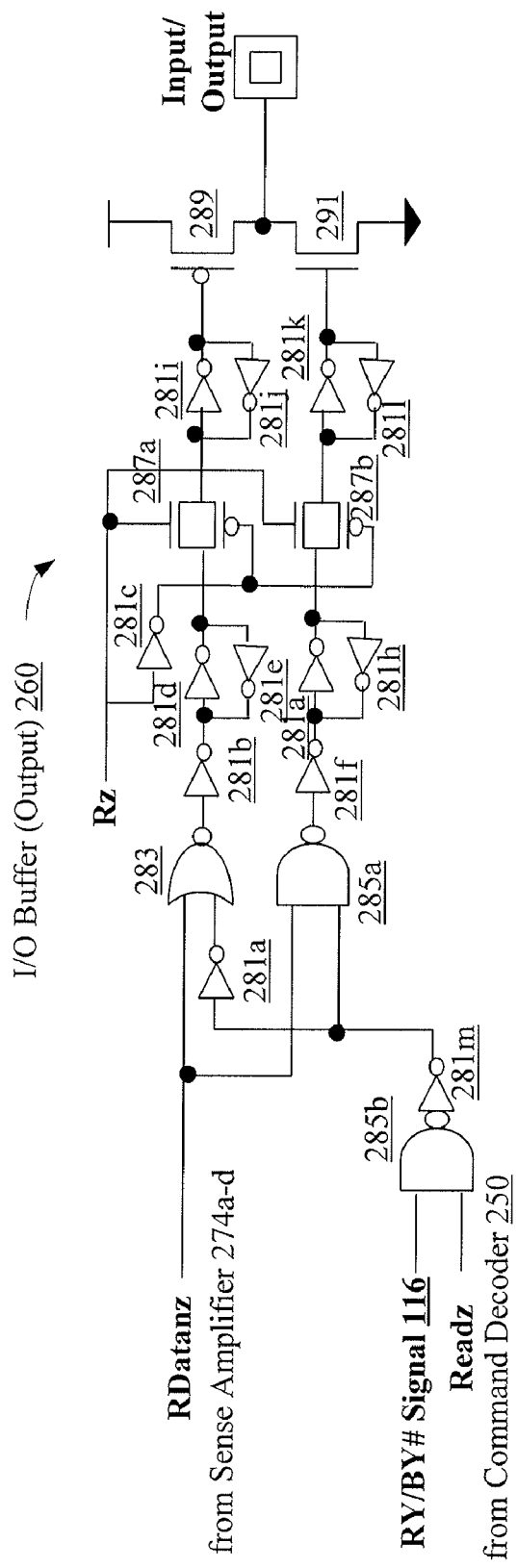
FIGS. 2D-2E collectively provide a block diagram of an exemplary embodiment of the I/O Buffer shown in FIG. 2A that is useful for understanding the present invention.
Figure 2E:
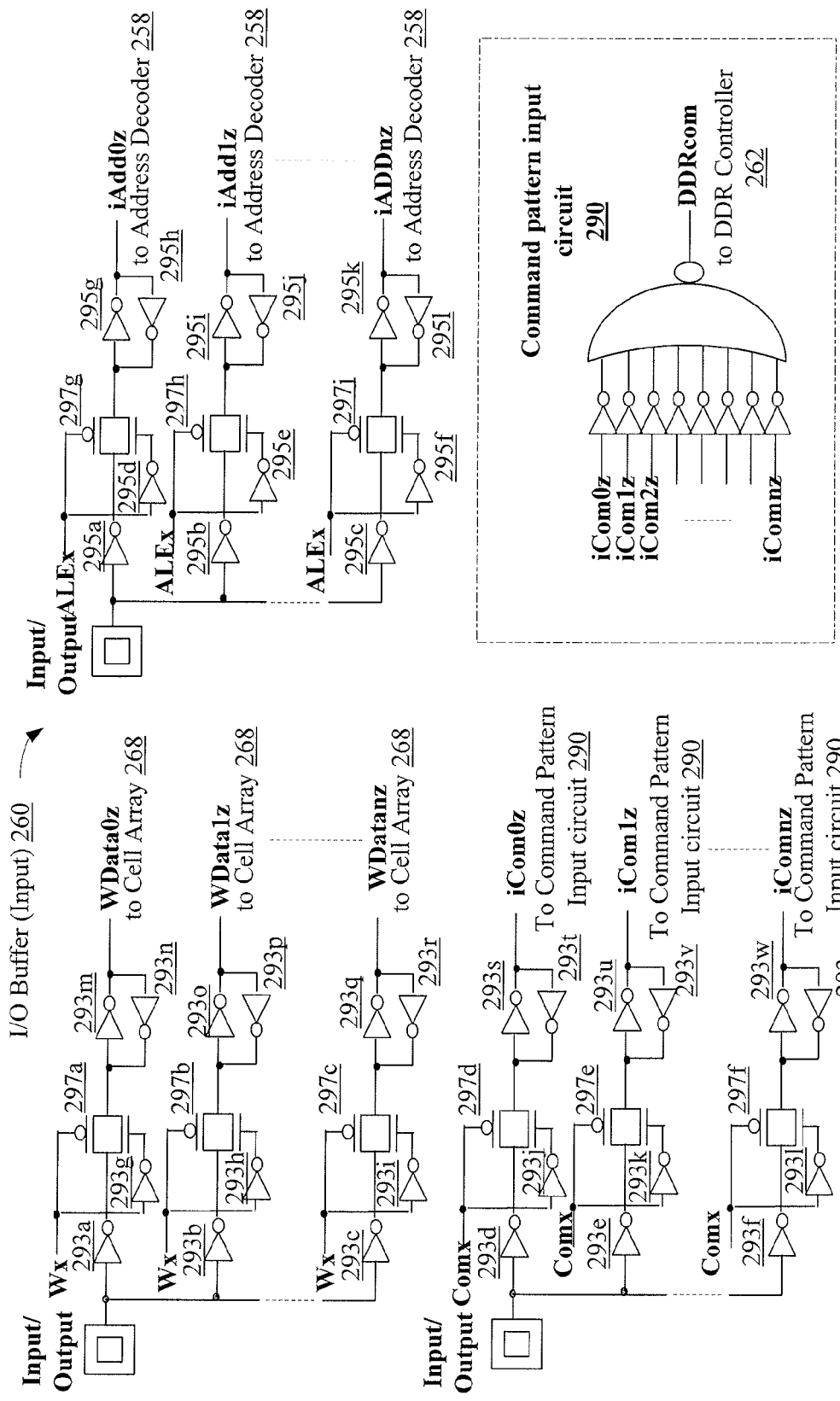

The I/O buffer 260 is communicatively coupled to an external data source (not shown in FIG. 2A) so as to receive data therefrom or communicate data thereto. An exemplary embodiment of the I/O buffer 260 is provided in FIGS. 2D and 2E. As shown in FIGS. 2D and 2E, the I/O buffer 260 includes a plurality of logic devices, switches $287a, 287b, 297a, 297b, \ldots, 297j$, transistors 289, 291 and a command pattern input circuit 290. The logic devices include, but are not limited to, NOT devices $281a, 281b, \ldots, 281m, 293a, 293b, \ldots, 293x, 295a, 295b, \ldots, 295l$, NAND devices $285a, 285b$, and NOR devices 283. When the memory 106 is in an SDR or DDR read mode, the I/O buffer 260 receives a command signal Readz from the command decoder 25, a RY/BY# signal from an external device and a command signal Rz from the DDR controller 262. In response to the signals Readz, RY/BY# and Rz, the I/O buffer 260 outputs data RDatanz received from the sense amplifier(s) $272a, 272b, 272c, 272d$ via the cache 276. This data RDatanz is output at a single data rate or double data defined by a pulse repetition rate of the pulse signal Rz. When the memory 106 is in an SDR or DDR write mode, the I/O buffer 260 receives command signals Wx, ALEx and Comx from the DDR controller 262. In response to the command signal Comx, the I/O buffer 260 communicates input command data iCom0z, iCom1z, ..., iComnz to a command pattern input circuit 290 thereof. The command pattern input circuit 290 is generally configured to generate a command signal DDRcom and communicate the same to the DDR controller 262. In response to the command signal ALEx, the I/O buffer 260 communicates address data iAdd0z, iAdd1z, ..., iAddnz to the address decoder 258. In response to the signal Wx, the I/O buffer 260 communicates input data WData1z, ..., WDatanz to the cell array 268 at a signal data rate or double data defined by a pulse repetition rate of the pulse signal Wz. Embodiments of the present invention are not limited in this regard.

Referring again to FIG. 2A, the AL/CG 256 receives address information from an external device (not shown in FIG. 2A) and processes the same. The AL/CG 256 communicates signals to the command decoder 250 indicating the status of the memory 106. The AL/CG 256 also communicates signals to the address decoder 258 indicating a memory address to which data is to be read from or the unit cell (e.g., unit cells $402_1, 402_2, \ldots, 402_g, 402_{g+1}, 402_{g+2}, \ldots, 402_G$ shown in FIG. 4) that is to have it's value refreshed. The address decoder 258 communicates address information to the Y-decoder 270 and the X-decoder 264.

Figure 3:
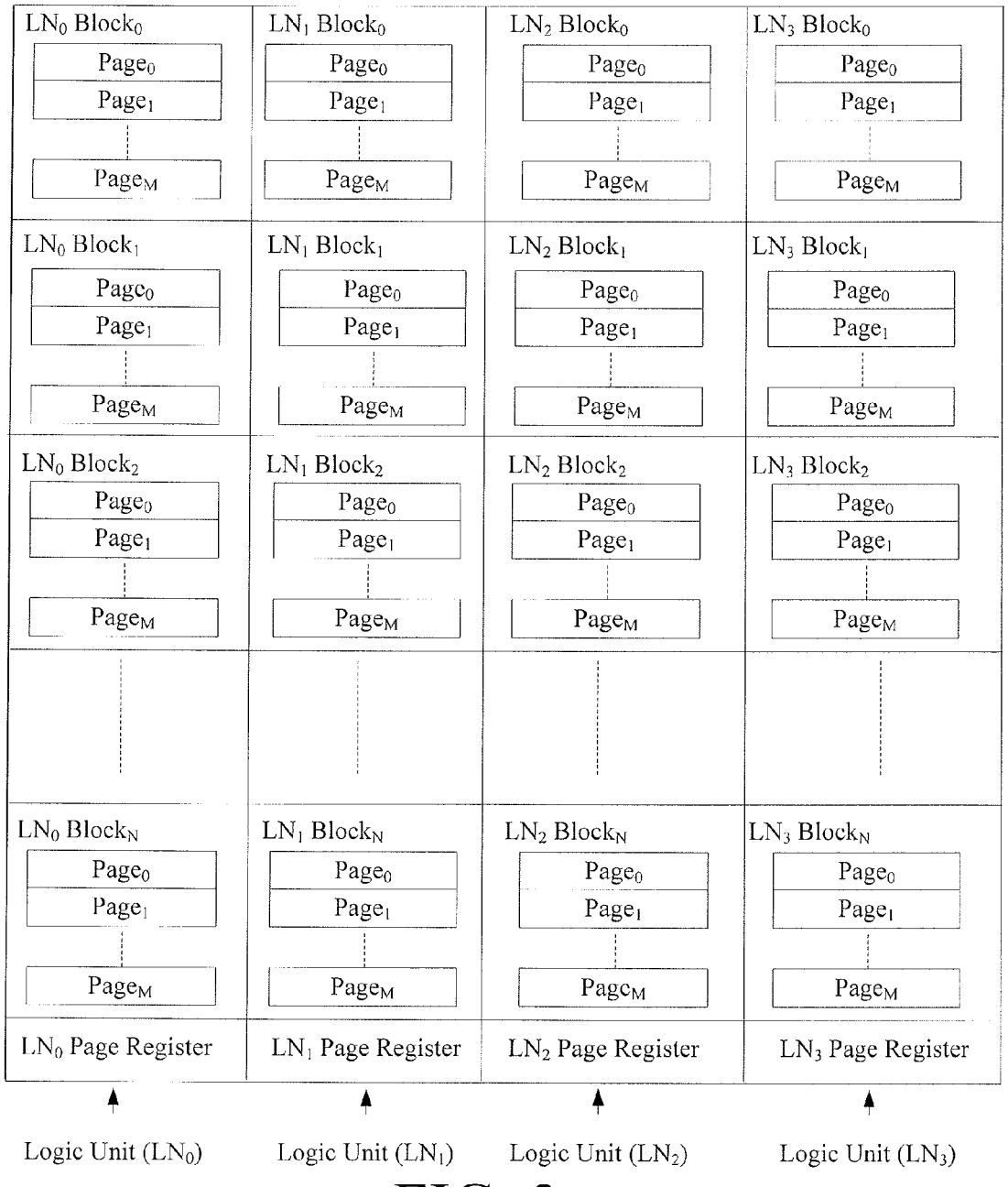
FIG. 3 is a detailed block diagram of the memory cell array shown in FIG. 2A that is useful for understanding the present invention.
Figure 4:
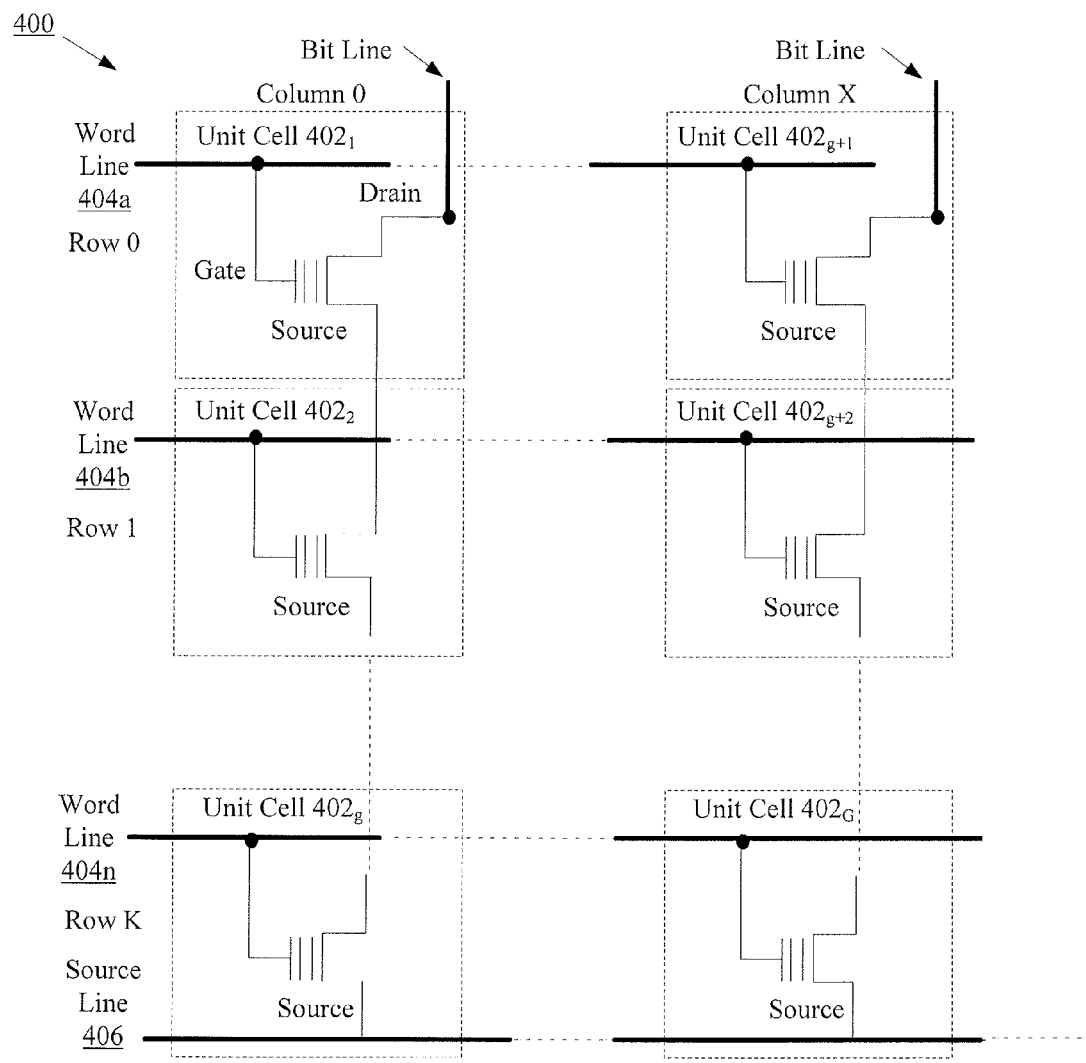
FIG. 4 is a schematic illustration of an exemplary memory cell structure of a data block of the memory cell array shown in FIG. 2A that is useful for understanding the present invention.

Referring now to FIG. 3, there is provided an exemplary memory organization 300 of the cell array 268 shown in FIG. 2A that is useful for understanding the present invention. As shown in FIG. 3, the memory organization 300 comprises a plurality of logic units $LN_0, LN_1, LN_2, LN_3$. Each of the logic units $LN_0, LN_1, LN_2, LN_3$ is the minimum unit that can independently execute commands and report status. For example, it is permissible to start a Page Program operation on logic unit $LN_0$, and then prior to the operation's completion to start a Read command on logic unit $LN_1$. Each of the logic units $LN_0, LN_1, LN_2, LN_3$ comprises at least one page register and a memory array. The flash array includes a plurality of Logic Unit (LN) blocks $LN_0$ Block$_0$, $LN_0$ Block$_1$, ..., $LN_0$ Block$_N$, $LN_1$ Block$_0$, $LN_1$ Block$_1$, ..., $LN_1$ Block$_N$, $LN_2$ Block$_0$, $LN_2$ Block$_1$, ..., $LN_2$ Block$_N$, $LN_3$ Block$_0$, $LN_3$ Block$_1$, ..., $LN_3$ Block$_N$. Each of the UN blocks is the smallest erasable unit of data within the memory array of a logic unit $LN_0, LN_1, LN_2, LN_3$. Each of the UN blocks contains a plurality of pages Page$_0$, Page$_1$, Page$_2$, Page$_3$. Each page Page$_0$, Page$_1$, Page$_2$, Page$_3$ is the smallest addressable unit for read and program operations. Each page Page$_0$, Page$_1$, Page$_2$, Page$_3$ comprises a plurality of memory unit cells (e.g., unit cells $402_1, 402_2, \ldots, 402_g, 402_{g+1}, 402_{g+2}, \ldots, 402_G$ shown in FIG. 4). Each unit cell (e.g., unit cells $402_1, 402_2, \ldots, 402_g, 402_{g+1}, 402_{g+2}, \ldots, 402_G$ shown in FIG. 4) comprises a cell transistor coupled to a respective bit line $272a, 272b, 272c, 272d$ (shown in FIG. 2A), a respective word line (e.g., word lines $404a, 404b, \ldots, 404n$ shown in FIG. 4), and a source line (e.g., the source line 406 shown in FIG. 4). Each unit cell (e.g., unit cells $402_1$, $402_2$, ..., $402_g$, $402_{g+1}$, $402_{g+2}$, ..., $402_G$ shown in FIG. 4) defines a logic state, either a "1" or a "0".

Figure 5:
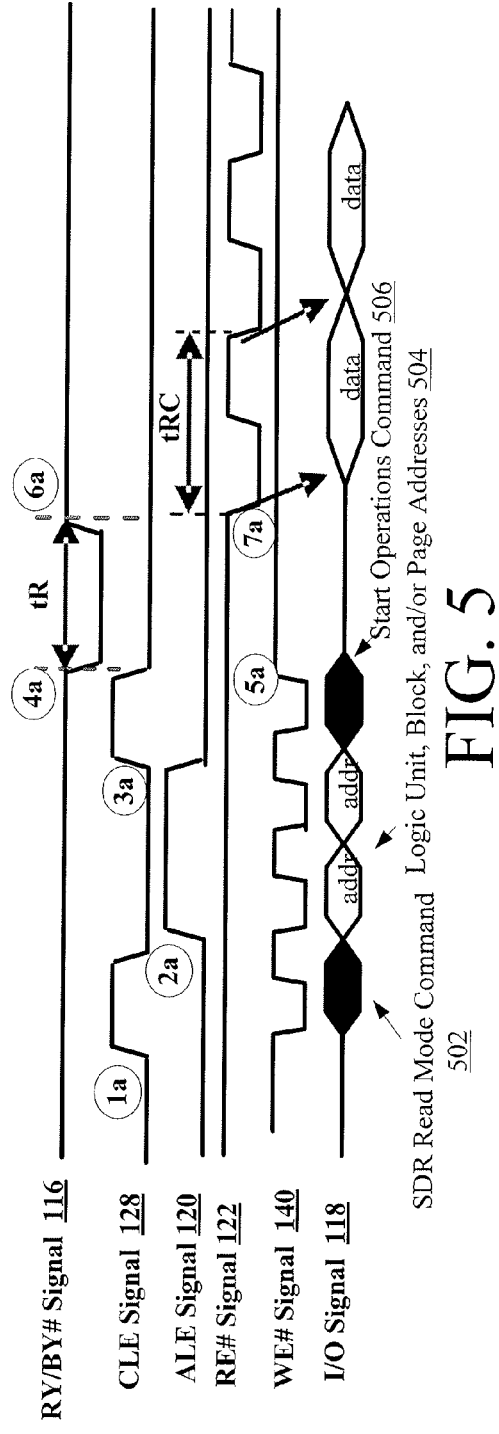
FIG. 5 is a schematic illustration of an Single Data Rate (SDR) read mode operation timing diagram according to an embodiment of the present invention.

Referring now to FIG. 5, there is provided a schematic illustration of an SDR read mode operation timing diagram 500 according to an embodiment of the present invention. As shown in FIG. 5, the CLE signal 128 transitions from a low signal level to a high signal level at time 1a. While the CLE signal 128 has a high signal level, a first command 502 is loaded into the memory 106 on the falling edge of a pulse of the WE# signal 140. The first command 502 is communicated from an external device (e.g., the controller 102 of FIG. 1) to a command decoder 250 via an I/O signal 118. The first command 502 is provided for placing the memory 106 in it's SDR read mode. After the first command 502 is loaded into the memory 106, the CLE signal 128 transitions from the high signal level to the low signal level.

Next, the ALE signal 120 transitions from a low signal level to a high signal level at time 2a. When the ALE signal 120 has a high signal level, address information 504 is loaded into the memory 106 on the falling edges of pulses of the WE# signal 140. The address information 504 can include, but is not limited to, a start address, a logic unit address, a block address and a page address. The address information 504 is communicated from the first external device (e.g., the controller 102 of FIG. 1) to the command decoder 250 of the memory via the I/O signal 118. After the address information 504 is loaded into the memory 106, the ALE signal 120 transitions from the high signal level to the low signal level.

Thereafter, the CLE signal 128 transitions from a low signal level to a high signal level at time 3a. While the CLE signal 128 has a high signal level, a second command 506 is loaded into the memory 106 on the falling edge of a pulse of the WE# signal 140. The second command 506 is communicated from the first external device (e.g., the controller 102 of FIG. 1) to the command decoder 250 of the memory 106 via the I/O signal 118. The second command 506 indicates the end of the address information 504. The second command 506 is a command for starting SDR read mode operations to read data from a cell array 268. After the second command 506 is loaded into the memory 106, the CLE signal 128 transitions from the high signal level to the low signal level. Also, the WE# signal transitions from the low signal level to the high signal level at time 5a. The WE# signal maintains a high signal level while data is output from the memory 106.

It should be noted that while the first command 502, address information 504 and second command 506 are loaded into the memory 106, the RY/BY# signal 116 has a high signal level. After the second command 506 is loaded into memory 106, the RY/BY# signal 116 transitions from the high signal level to the low signal level at time 4a. Prior to outputting data from the memory 106, the RY/BY# signal 116 transitions from the low signal level to the high signal level at time 6a. The period of time between time 4a and time 6a is referred to as "tR". The time period "tR" represents a "busy" period in which data will not be output from the memory 106. While data is output from the memory 106, the RY/BY# signal 116 maintains a high signal level.

As shown in FIG. 5, the data is output from the memory 106 at a signal data rate. Accordingly, the data output is triggered only on the falling edges of pulses of an RE# signal 122. For example, the first data output is triggered on the falling edge of a first pulse of the RE# signal at time 7a. The data is communicated from the memory 106 to the first external device via the I/O signal 118. However, embodiments of the present invention are not limited in this regard. For example, the data output from the memory can alternatively be triggered on the rising edges of pulses of the RE# signal (not shown).

Figure 6:
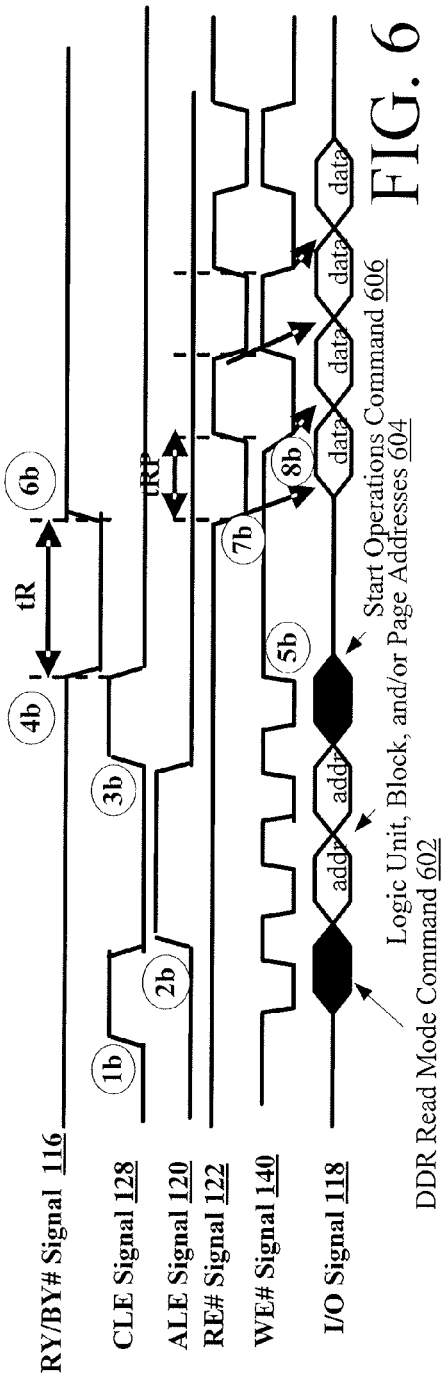
FIG. 6 is a schematic illustration of a Double Data Rate (DDR) read mode operation timing diagram according to an embodiment of the present invention.

Referring now to FIG. 6, there is provided a schematic illustration of a DDR read mode operation timing diagram 600 according to an embodiment of the present invention. As shown in FIG. 6, the CLE signal 128 transitions from a low signal level to a high signal level at time 1b. While the CLE signal 128 has a high signal level, a first command 602 is loaded into the memory 106 on the falling edge of a pulse of the WE# signal 140. The first command 602 is communicated from an external device (e.g., the controller 102 of FIG. 1) to a command decoder 250 via an I/O signal 118. The first command 602 is provided for placing the memory 106 in it's DDR read mode. After the first command 602 is loaded into the memory 106, the CLE signal 128 transitions from the high signal level to the low signal level.

Next, the ALE signal 120 transitions from a low signal level to a high signal level at time 2b. When the ALE signal 120 has a high signal level, address information 604 is loaded into the memory 106 on the falling edges of pulses of the WE# signal 140. The address information 604 can include, but is not limited to, a start address, a logic unit address, a block address and a page address. The address information 604 is communicated from the first external device (e.g., the controller 102 of FIG. 1) to the command decoder 250 of the memory via the I/O signal 118. After the address information 604 is loaded into the memory 106, the ALE signal 120 transitions from the high signal level to the low signal level.

Thereafter, the CLE signal 128 transitions from a low signal level to a high signal level at time 3b. While the CLE signal 128 has a high signal level, a second command 606 is loaded into the memory 106 on the falling edge of a pulse of the WE# signal 140. The second command 606 is communicated from the first external device (e.g., the controller 102 of FIG. 1) to the command decoder 250 of the memory 106 via the I/O signal 118. The second command 606 indicates the end of the address information 604. The second command 606 is a command for starting DDR read mode operations to read data from a cell array 268. After the second command 606 is loaded into the memory 106, the CLE signal 128 transitions from the high signal level to the low signal level. Also, the WE# signal 140 transitions from the low signal level to the high signal level at time 5b.

It should be noted that while the first command 602, address information 604 and second command 606 are loaded into the memory 106, the RY/BY# signal 116 has a high signal level. After the second command 606 is loaded into memory 106, the RY/BY# signal 116 transitions from the high signal level to the low signal level at time 4b. Prior to outputting data from the memory 106, the RY/BY# signal 116 transitions from the low signal level to the high signal level at time 6b. The period of time between time 4b and time 6b is referred to as "tR". The time period "tR" represents a "busy" period in which data will not be output from the memory 106. While data is output from the memory 106, the RY/BY# signal 116 maintains a high signal level.

As shown in FIG. 6, the data is output from the memory 106 at a double data rate. Accordingly, the data output is triggered on the falling edges of pulses of an RE# signal 122 and the WE# signal 140. It should be noted that the portion of the WE# signal 140 shown after time 7b in FIG. 6 represents the complimentary RE# signal generated by the DDR controller 262. For example, a first data output is triggered on the falling edge of a first pulse of the RE# signal at time 7b. A second data output is triggered on the falling edge of a first pulse of the WE# signal 140 (or complimentary RE# signal) at time 8b. The data is communicated from the memory 106 to the first external device via the I/O signal 118. However, embodiments of the present invention are not limited in this regard. For example, the data output from the memory can alternatively be triggered on the rising edges of pulses of the RE# signal (not shown) and WE# signal (or complimentary RE# signal) after time 7b.

Figure 7:
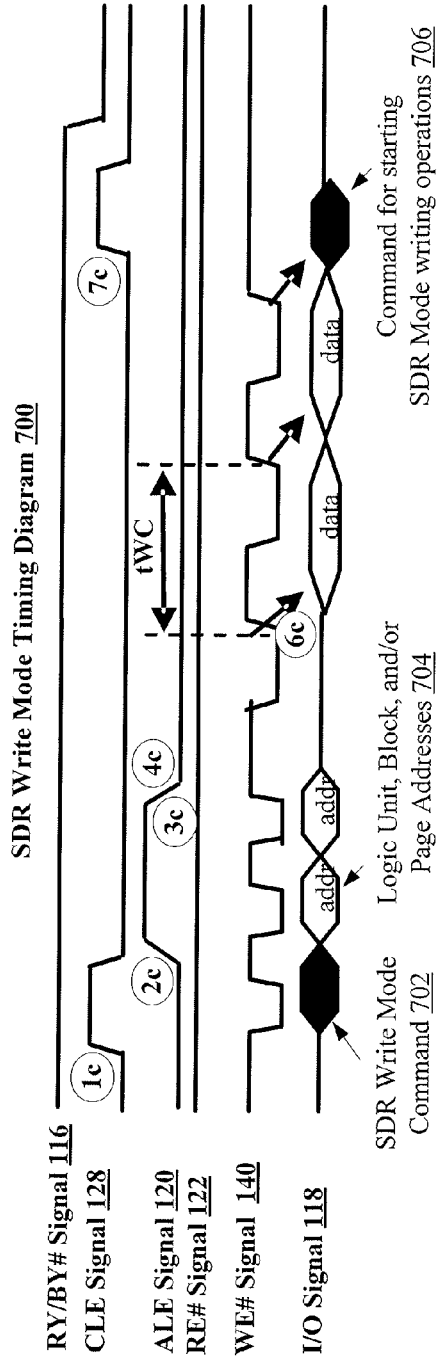
FIG. 7 is a schematic illustration of an SDR write mode operation timing diagram according to an embodiment of the present invention.

Referring now to FIG. 7, there is provided a schematic illustration of an SDR write mode operation timing diagram 700 according to an embodiment of the present invention. As shown in FIG. 7, the CLE signal 128 transitions from a low signal level to a high signal level at time 1c. While the CLE signal 128 has a high signal level, a first command 702 is loaded into the memory 106 on the falling edge of a pulse of the WE# signal 140. The first command 702 is communicated from an external device (e.g., the controller 102 of FIG. 1) to a command decoder 250 via an I/O signal 118. The first command 702 is provided for placing the memory 106 in it's SDR write mode. After the first command 702 is loaded into the memory 106, the CLE signal 128 transitions from the high signal level to the low signal level.

Next, the ALE signal 120 transitions from a low signal level to a high signal level at time 2c. When the ALE signal 120 has a high signal level, address information 704 is loaded into the memory 106 on the falling edges of pulses of the WE# signal 140. The address information 704 can include, but is not limited to, a start address, a logic unit address, a block address and a page address. The address information 704 is communicated from the first external device (e.g., the controller 102 of FIG. 1) to the command decoder 250 of the memory via the I/O signal 118. After the address information 704 is loaded into the memory 106, the ALE signal 120 transitions from the high signal level to the low signal level at time 3c.

As shown in FIG. 7, data is loaded into the memory 106 after time "tALS" has expired. Time "tALS" is defined by a start time 4c and an end time 6c. As shown in FIG. 7, the data is loaded into the memory 106 at a single data rate. Accordingly, the data input is triggered on the falling edges of pulses of a WE# signal 140. For example, the first data input is triggered on the falling edge of a first pulse of the WE# signal 140 at time 6c. The data is communicated from the first external device to the memory 106 via the I/O signal 118. However, embodiments of the present invention are not limited in this regard. For example, the data in to the memory can alternatively be triggered on the falling edges of pulses of the WE# signal 140

Subsequent to loading the data into memory 106, the CLE signal 128 transitions from a low signal level to a high signal level at time 7c. While the CLE signal 128 has a high signal level, a second command 706 is loaded into the memory 106 on the rising edge of a pulse of the WE# signal 140. The second command 706 is communicated from an external device (e.g., the controller 102 of FIG. 1) to a command decoder 250 via an I/O signal 118. The second command 706 is provided for starting SDR mode writing operations to program data into a core cell (i.e., a particular LN block $LN_0$ $Block_0$, $LN_0$ $Block_1$, ..., $LN_0$ $Block_N$, $LN_1$ $Block_0$, $LN_1$ $Block_1$, ..., $LN_1$ $Block_N$, $LN_2$ $Block_0$, $LN_2$ $Block_1$, ..., $LN_2$ $Block_N$, $LN_3$ $Block_0$, $LN_3$ $Block_1$, ..., $LN_3$ $Block_N$ of a cell array 268 and/or a particular page $Page_0$, $Page_1$, $Page_2$, $Page_3$ of the LN block). After the second command 706 is loaded into the memory 106, the CLE signal 128 transitions from the high signal level to the low signal level.

Figure 8:
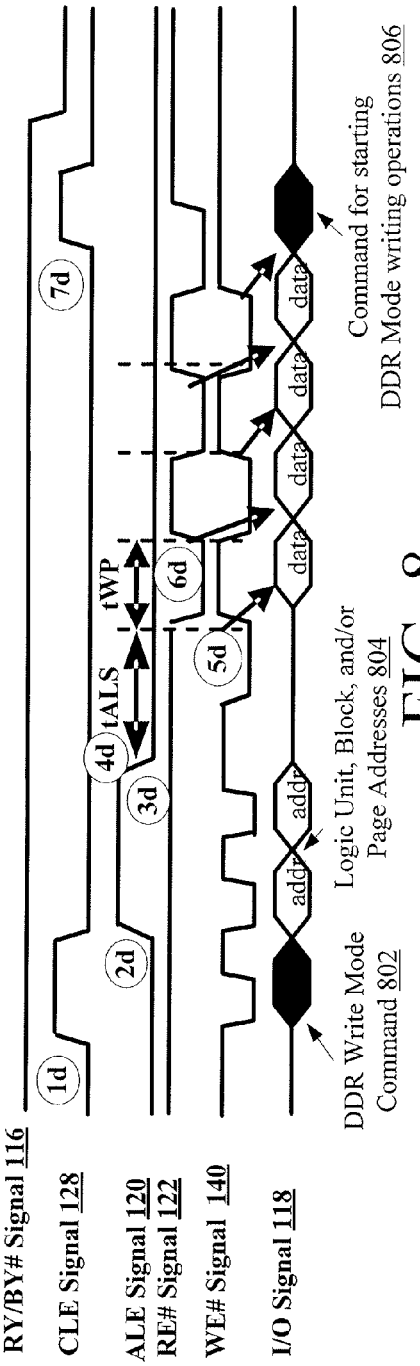
FIG. 8 is a schematic illustration of a DDR write mode operation timing diagram according to an embodiment of the present invention.

FIG. 8 is a schematic illustration of a DDR write mode operation timing diagram 800 according to an embodiment of the present invention. As shown in FIG. 8, the CLE signal 128 transitions from a low signal level to a high signal level at time 1d. While the CLE signal 128 has a high signal level, a first command 802 is loaded into the memory 106 on the falling edge of a pulse of the WE# signal 140. The first command 802 is communicated from an external device (e.g., the controller 102 of FIG. 1) to a command decoder 250 via an I/O signal 118. The first command 802 is provided for placing the memory 106 in it's DDR write mode. After the first command 802 is loaded into the memory 106, the CLE signal 128 transitions from the high signal level to the low signal level.

Next, the ALE signal 120 transitions from a low signal level to a high signal level at time 2d. When the ALE signal 120 has a high signal level, address information 804 is loaded into the memory 106 on the falling edges of pulses of the WE# signal 140. The address information 804 can include, but is not limited to, a start address, a logic unit address, a block address and a page address. The address information 804 is communicated from the first external device (e.g., the controller 102 of FIG. 1) to the command decoder 250 of the memory via the I/O signal 118. After the address information 804 is loaded into the memory 106, the ALE signal 120 transitions from the high signal level to the low signal level at time 3d.

As shown in FIG. 8, data is loaded into the memory 106 after time "tALS" has expired. Time "tALS" is defined by a start time 4d and an end time 5d. As shown in FIG. 8, the data is loaded into the memory 106 at a double data rate. Accordingly, the data input is triggered on the falling edges of pulses of a WE# signal 140 and an RE# signal 122. It should be noted that the portion of the RE# signal 122 shown after time 5d in FIG. 8 represents the complimentary WE# signal generated by the DDR controller 262. For example, a first data output is triggered on the rising edge of a first pulse of the WE# signal at time 5d. A second data output is triggered on the rising edge of a first pulse of the RE# signal 122 (or complimentary WE# signal) at time 6d. The data is communicated to the memory 106 from the first external device via the I/O signal 118. However, embodiments of the present invention are not limited in this regard. For example, the data input can alternatively be triggered on the falling edges of pulses of the WE# signal (not shown) and RE# signal (or complimentary WE# signal) after time 5d.

Subsequent to loading the data into memory 106, the CLE signal 128 transitions from a low signal level to a high signal level at time 7d. While the CLE signal 128 has a high signal level, a second command 806 is loaded into the memory 106 on the rising edge of a pulse of the WE# signal 140. The second command 806 is communicated from an external device (e.g., the controller 102 of FIG. 1) to a command decoder 250 via an I/O signal 118. The second command 806 is provided for starting DDR mode writing operations to program data into a core cell (i.e., a particular LN block $LN_0$ $Block_0$, $LN_0$ $Block_1$, ..., $LN_0$ $Block_N$, $LN_1$ $Block_0$, $LN_1$ $Block_1$, ..., $LN_1$ $Block_N$, $LN_2$ $Block_0$, $LN_2$ $Block_1$, ..., $LN_2$ $Block_N$, $LN_3$ $Block_0$, $LN_3$ $Block_1$, ..., $LN_3$ $Block_N$ of a cell array 268 and/or a particular page $Page_0$, $Page_1$, $Page_2$, $Page_3$ of the LN block). After the second command 806 is loaded into the memory 106, the CLE signal 128 transitions from the high signal level to the low signal level.

As evident from the above described FIGS. 5-8, the read cycle time (i.e., tRC-tRP) and write cycle time (i.e., tWC-tWP) of the DDR modes can be significantly less than those (i.e., tRC and tWC) of the SDR modes. For example, if the ready time (i.e., tR) is twenty-five micro second (25 μs), the read cycle time is twenty-five nano seconds (25 ns) and the data is of eight kilo bytes (8 Kbyte), then the cycle times tRC and tWC of the SDR mode equal two hundred twenty-five micro seconds (225 μs). Also, the cycle times tRC-tRP and tWC-tWP of the DDR mode equal one hundred twenty-five micro seconds (125 μs). Therefore, the time required for data writing or reading can be decreased at least by forty percent (40%) by employing the DDR mode implementation of the present invention. Moreover, this data writing and reading time reduction is achieved without changing the existing pin configurations of the controller 102 and memory 106, 206.

The following FIGS. 9A-10B and accompanying text illustrate methods 900, 1000 according to embodiments of the present invention for interfacing a memory device operative in an SDR read/write mode and/or a DDR read/write mode. It should be appreciated, however, that the methods 900, 1000 disclosed herein are provided for purposes of illustration only and that embodiments of the present invention are not limited solely to the method shown.

Figure 9A:
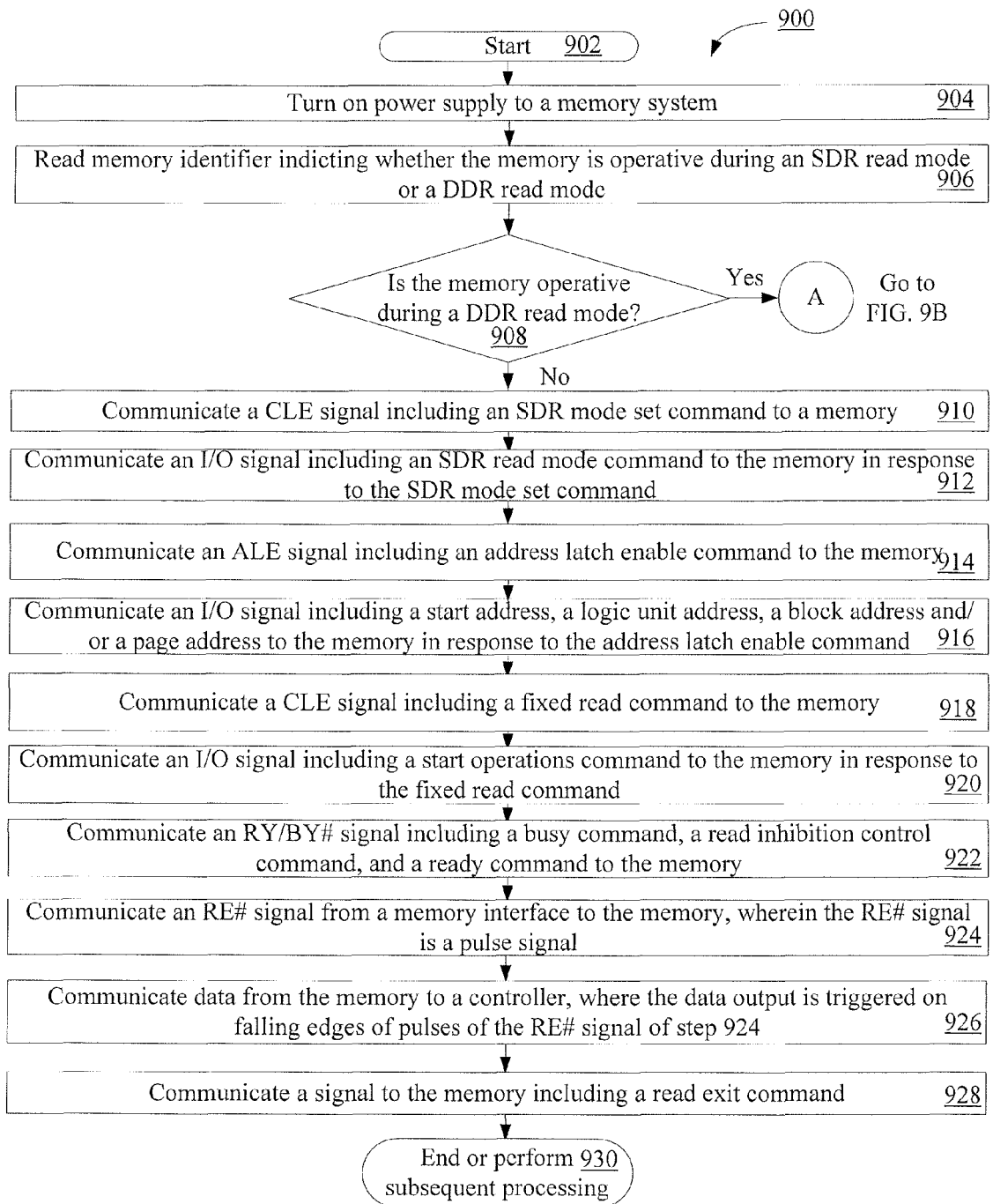
FIGS. 9A-9B collectively provide a flow diagram of a method for interfacing a memory device operative in an SDR read mode and/or a DDR read mode according to an embodiment of the present invention.
Figure 9B:
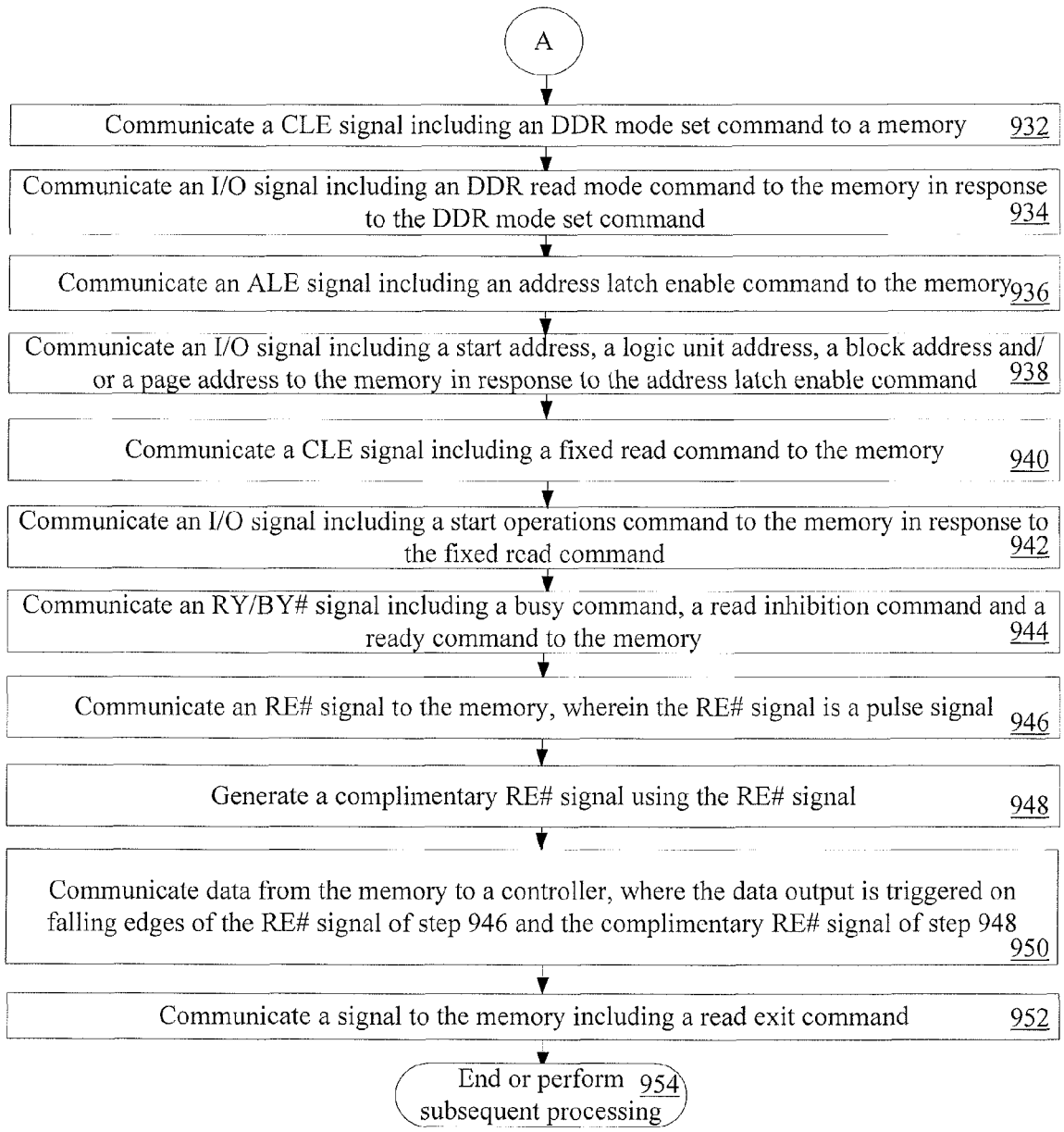

Referring now to FIGS. 9A-9B, there is provided a schematic illustration of the method 900 for interfacing a memory device operative in an SDR read mode and/or a DDR read mode. As shown in FIG. 9A, the method 900 begins with step 902 and continues with step 904. In step 904, a power supply to a memory system (e.g., the system 100 of FIG. 1) is turned on. Subsequently, step 906 is performed where a memory identifier is read from a memory (e.g., the memory 106 of FIGS. 1 and 2A). The memory identifier includes information indicating whether the memory is operative during an SDR read mode or a DDR read mode. Next, a decision step 908 is performed to determine if the memory is operative in a DDR read mode. If the memory is operative in a DDR read mode [908:YES], then the method 900 continues with step 932 of FIG. 9B. Step 932 of FIG. 9B will be described below. If the memory is not operative in a DDR read mode [908:NO], then the method 900 continues with steps 910-930.

Step 910 generally involves communicating a CLE signal including an SDR mode set command to the memory. The SDR mode set command can be defined by a transition of the CLE signal from a low signal level to a high signal level. In response to the SDR mode set command, step 912 is performed where an SDR read mode command (e.g., the SDR read mode command 502 of FIG. 5) is communicated from a controller (e.g., the controller 102 of FIG. 1) to the memory via an I/O signal (e.g., the I/O signal 118 of FIGS. 1 and 2A). As a result of receiving the SDR read mode command, the memory 106 is placed in it's SDR read mode.

In a next step 914, an ALE signal including an address latch enable command is communicated to the memory. The address latch enable command is defined by a transition of the ALE signal from a low signal level to a high signal level. In response to the address latch enable command, step 916 is performed where address information (e.g., the addresses information 504 of FIG. 5) is loaded into the memory on the falling edges of pulses of the WE# signal. The address information can include, but is not limited to, a start address, a logic unit address, a logic unit block address, and a page address. After the address information is loaded into the memory, the ALE signal transitions from the high signal level to the low signal level.

Upon completing step 916, the method 900 continues with step 918. Step 918 generally involves communicating a CLE signal including a fixed read command to the memory. The fixed read command can be defined by a transition of the CLE signal from a low signal level to a high signal level. In response to the fixed read command, step 920 is performed where a state operations command (e.g., the start operations command 506 of FIG. 5) is communicated from a controller (e.g., the controller 102 of FIG. 1) to the memory via the I/O signal.

After receiving the start operations command at the memory, step 922 is performed where an RY/BY# signal including a busy command is communicated from the controller to the memory. The busy command can be defined by a transition of the RY/BY# signal from a high signal level to a low signal level. Step 922 also involves communicating a read inhibition control command and a ready command from the controller to the memory. The ready command can be defined by a transition of the RY/BY# signal from the low signal level to the high signal level. The duration between the busy command and the ready command is referred to as tR. During the time period tR, data is not output from the memory 106.

After the time period tR has expired, step 924 is performed where an RE# signal is communicated to the memory. The RE# signal is a pulse signal. Next, step 926 is performed where data is output from the memory at a signal data rate. Accordingly, data output is triggered on the falling edges of pulses of the RE# signal. In a next step 928, a signal including a read exit command is communicated to the memory. Thereafter, the method 900 continues with step 930 where the method 900 ends or other processing is resumed.

Referring now to FIG. 9B, DDR read mode operations begin with step 932. Step 932 generally involves communicating a CLE signal including a DDR mode set command to the memory. The DDR mode set command can be defined by a transition of the CLE signal from a low signal level to a high signal level. In response to the DDR mode set command, step 934 is performed where a DDR read mode command (e.g., the DDR read mode command 602 of FIG. 6) is communicated from a controller (e.g., the controller 102 of FIG. 1) to the memory via an I/O signal (e.g., the I/O signal 118 of FIGS. 1 and 2A). As a result of receiving the DDR read mode command, the memory 106 is placed in it's DDR read mode.

In a next step 936, an ALE signal including an address latch enable command is communicated to the memory. The address latch enable command is defined by a transition of the ALE signal from a low signal level to a high signal level. In response to the address latch enable command, step 938 is performed where address information (e.g., the addresses information 604 of FIG. 6) is loaded into the memory on the falling edges of pulses of the WE# signal. The address information can include, but is not limited to, a start address, a logic unit address, a logic unit block address, and a page address. After the address information is loaded into the memory, the ALE signal transitions from the high signal level to the low signal level.

Upon completing step 938, the method 900 continues with step 940. Step 940 generally involves communicating a CLE signal including a fixed read command to the memory. The fixed read command can be defined by a transition of the CLE signal from a low signal level to a high signal level. In response to the fixed read command, step 942 is performed where a state operations command (e.g., the start operations command 606 of FIG. 6) is communicated from a controller (e.g., the controller 102 of FIG. 1) to the memory via the I/O signal.

After receiving the start operations command at the memory, step 944 is performed where an RY/BY# signal including a busy command is communicated from the controller to the memory. The busy command can be defined by a transition of the RY/BY# signal from a high signal level to a low signal level. Step 944 also involves communicating a read inhibition control command and a ready command from the controller to the memory. The ready command can be defined by a transition of the RY/BY# signal from the low signal level to the high signal level. The duration between the busy command and the ready command is referred to as tR.

During the time period tR, data is not output from the memory 106.

After the time period tR has expired, step 946 is performed where an RE# signal is communicated to the memory. The RE# signal is a pulse signal. Next, step 948 is performed where a complimentary RE# signal is generated at the memory using the RE# signal. In step 950, the data is output from the memory at a double data rate. Accordingly, data output is triggered on the falling edges of pulses of the RE# signal and the complimentary RE# signal. In a next step 952, a signal including a read exit command is communicated to the memory. Thereafter, the method 900 continues with step 954 where the method 900 ends or other processing is resumed.

Figure 10B:
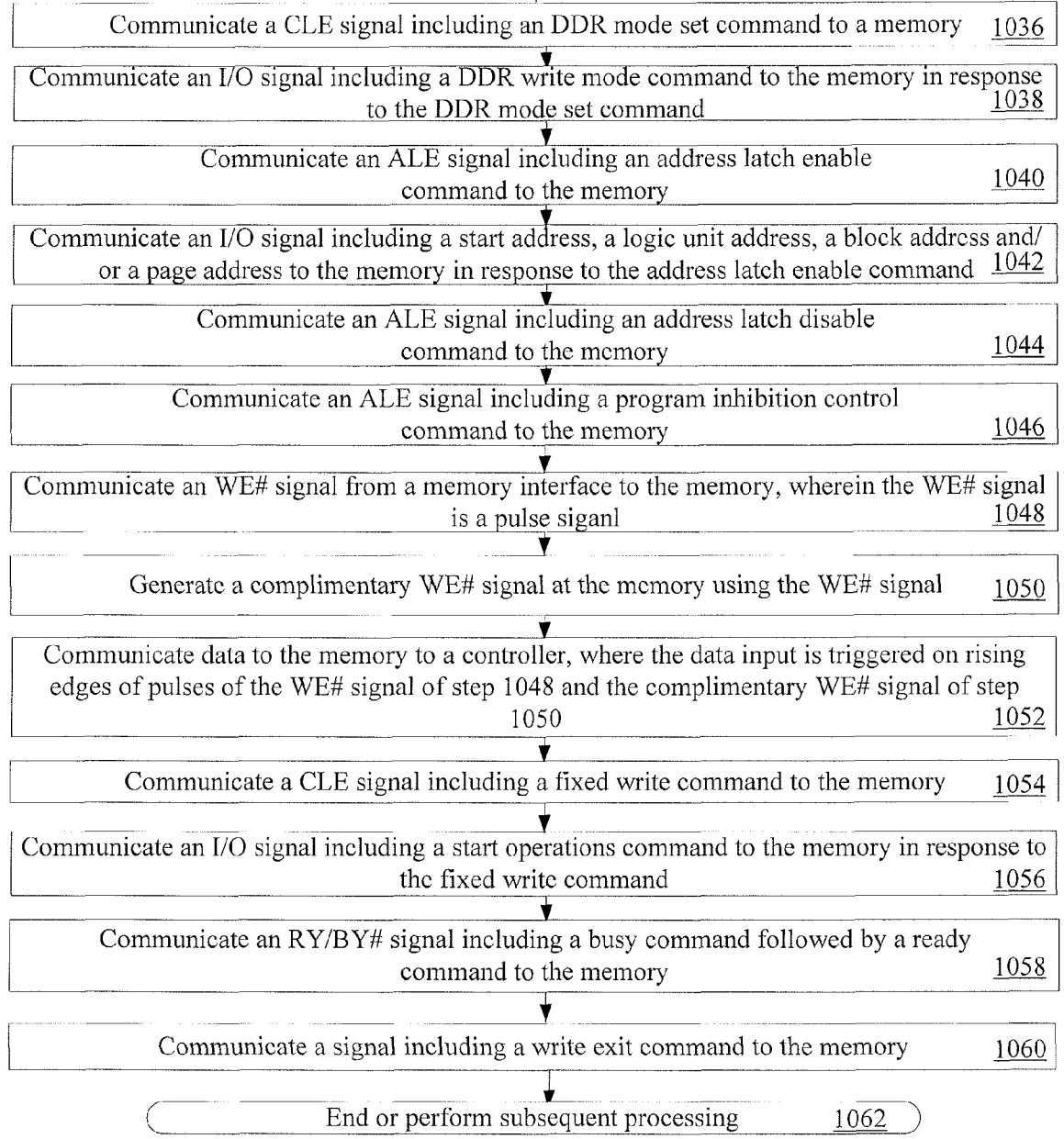

Referring now to FIGS. 10A-10B, there is provided a flow diagram of a method 1000 for interfacing a memory device operative in an SDR write mode and/or a DDR write mode according to an embodiment of the present invention. As shown in FIG. 10A, the method 1000 begins with step 1002 and continues with step 1004. In step 1004, a power supply to a memory system (e.g., the system 100 of FIG. 1) is turned on. Subsequently, step 1006 is performed where a memory identifier is read from a memory (e.g., the memory 106 of FIGS. 1 and 2A). The memory identifier includes information indicating whether the memory is operative during an SDR write mode or a DDR write mode. Next, a decision step 1008 is performed to determine if the memory is operative in a DDR write mode. If the memory is operative in a DDR write mode [1008:YES], then the method 1000 continues with step 1036 of FIG. 10B. Step 1036 of FIG. 10B will be described below. If the memory is not operative in a DDR read mode [1008: NO], then the method 1000 continues with steps 1010-1034.

Step 1010 generally involves communicating a CLE signal including an SDR mode set command to the memory. The SDR mode set command can be defined by a transition of the CLE signal from a low signal level to a high signal level. In response to the SDR mode set command, step 1012 is performed where an SDR write mode command (e.g., the SDR write mode command 702 of FIG. 7) is communicated from a controller (e.g., the controller 102 of FIG. 1) to the memory via an I/O signal (e.g., the I/O signal 118 of FIGS. 1 and 2A). As a result of receiving the SDR write mode command, the memory 106 is placed in it's SDR write mode.

In a next step 1014, an ALE signal including an address latch enable command is communicated to the memory. The address latch enable command is defined by a transition of the ALE signal from a low signal level to a high signal level. In response to the address latch enable command, step 1016 is performed where address information (e.g., the addresses information 704 of FIG. 7) is loaded into the memory on the falling edges of pulses of the WE# signal. The address information can include, but is not limited to, a start address, a logic unit address, a logic unit block address, and a page address. After the address information is loaded into the memory, the ALE signal transitions from the high signal level to the low signal level.

Upon completing step 1016, the method 1000 continues with step 1018. Step 1018 generally involves communicating an ALE signal including an address latch disable command to the memory. The address latch disable command can be defined by a transition of the ALE signal from a high signal level to a low signal level. In a next step 1020, an ALE signal including a program inhibition control command is communicated to the memory. The program inhibition control command is defined by a low signal level of the ALE signal occurring after the address latch disable command. The program inhibition control command has a duration of tALS.

During the time period tALS, data is not input into the memory.

Upon expiration of the time period tALS, step 1022 is performed where a WE# signal is communicated to the memory. The WE# signal is a pulse signal. Next, step 1024 is performed where data is input into the memory at a single data rate. Accordingly, data input is triggered on the rising edges of pulses of the WE# signal. In step 1026, a CLE signal including a fixed write command is communicated to the memory. The fixed write command can be defined by a transition of the CLE signal from a low signal level to a high signal level. In response to the fixed write command, step 1028 is performed where a start operations command (e.g., the start operations command 706 of FIG. 7) is communicated from a controller (e.g., the controller 102 of FIG. 1) to the memory via the I/O signal.

Subsequent to completing step 1028, step 1030 is performed where an RY/BY# signal is communicated to the memory. The RY/BY# signal includes a busy command followed by a ready command. The busy command can be defined by a transition of the RY/BY# signal from a high signal level to a low signal level. The ready command can be defined by a transition of the RY/BY# signal from the low signal level to the high signal level. In a next step 1032, a signal including a read exit command is communicated to the memory. Thereafter, the method 1000 continues with step 1034 where the method 1000 ends or other processing is resumed.

Referring now to FIG. 10B, the DDR write operations will be described. The DDR write operations being with step 1036. Step 1036 generally involves communicating a CLE signal including a DDR mode set command to the memory. The DDR mode set command can be defined by a transition of the CLE signal from a low signal level to a high signal level. In response to the DDR mode set command, step 1038 is performed where a DDR write mode command (e.g., the DDR write mode command 802 of FIG. 8) is communicated from a controller (e.g., the controller 102 of FIG. 1) to the memory via an I/O signal (e.g., the I/O signal 118 of FIGS. 1 and 2A). As a result of receiving the DDR write mode command, the memory 106 is placed in it's DDR write mode.

In a next step 1040, an ALE signal including an address latch enable command is communicated to the memory. The address latch enable command is defined by a transition of the ALE signal from a low signal level to a high signal level. In response to the address latch enable command, step 1042 is performed where address information (e.g., the addresses information 804 of FIG. 8) is loaded into the memory on the falling edges of pulses of the WE# signal. The address information can include, but is not limited to, a start address, a logic unit address, a logic unit block address, and a page address. After the address information is loaded into the memory, the ALE signal transitions from the high signal level to the low signal level.

Upon completing step 1042, the method 1000 continues with step 1044. Step 1044 generally involves communicating an ALE signal including an address latch disable command to the memory. The address latch disable command can be defined by a transition of the ALE signal from a high signal level to a low signal level. In a next step 1046, an ALE signal including a program inhibition control command is communicated to the memory. The program inhibition control command is defined by a low signal level of the ALE signal occurring after the address latch disable command. The program inhibition control command has a duration of tALS.

During the time time period tALS, data is not input into the memory.

Upon expiration of the time period tALS, step 1048 is performed where a WE# signal is communicated to the memory. The WE# signal is a pulse signal. Next, step 1050 is performed where a complimentary WE# signal is generated at the memory using the WE# signal. Thereafter, step 1052 is performed where data is input into the memory at a double data rate. Accordingly, data input is triggered on the rising edges of pulses of the WE# signal and the complimentary WE# signal. In step 1054, a CLE signal including a fixed write command is communicated to the memory. The fixed write command can be defined by a transition of the CLE signal from a low signal level to a high signal level. In response to the fixed write command, step 1056 is performed where a start operations command (e.g., the start operations command 806 of FIG. 8) is communicated from a controller (e.g., the controller 102 of FIG. 1) to the memory via the I/O signal.

Subsequent to completing step 1056, step 1058 is performed where an RY/BY# signal is communicated to the memory. The RY/BY# signal includes a busy command followed by a ready command. The busy command can be defined by a transition of the RY/BY# signal from a high signal level to a low signal level. The ready command can be defined by a transition of the RY/BY# signal from the low signal level to the high signal level. In a next step 1060, a signal including a read exit command is communicated to the memory. Thereafter, the method 1000 continues with step 1062 where the method 1000 ends or other processing is resumed.

In light of the forgoing description of the invention, it should be recognized that the present invention can be realized in hardware, software, or a combination of hardware and software. A method for interfacing a memory device operative in an SDR read/write mode and/or a DDR read/write mode according to the present invention can be realized in a centralized fashion in one processing system, or in a distributed fashion where different elements are spread across several interconnected processing systems. Any kind of computer system, or other apparatus adapted for carrying out the methods described herein, is suited. A typical combination of hardware and software could be a general purpose computer processor, with a computer program that, when being loaded and executed, controls the computer processor such that it carries out the methods described herein. Of course, an application specific integrated circuit (ASIC), and/or a field programmable gate array (FPGA) could also be used to achieve a similar result.

Applicants present certain theoretical aspects above that are believed to be accurate that appear to explain observations made regarding embodiments of the present invention. However, embodiments of the present invention may be practiced without the theoretical aspects presented. Moreover, the theoretical aspects are presented with the understanding that Applicants do not seek to be bound by the theory presented.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others having ordinary skill in the art upon the reading and understanding of this specification and the annexed drawings. In addition, while a particular feature of the present invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A method for reading data from or writing data to a memory device, comprising:
    receiving a first pulse signal having a first pulse frequency at the memory device;
    generating, at the memory device, a second pulse signal using the first pulse signal, the second pulse signal being a compliment of the first pulse signal and having a second pulse frequency that is equal to the first frequency;
    using the first pulse signal to control first read/write operations so that first data is output from or input to the memory device at a first data rate; and
    using the first and second pulse signals to control second read/write operations so that second data is output from or input to the memory device at a second data rate that is twice the first data rate.

2. The method according to claim 1, wherein the output of the first data is triggered on select edges of a plurality of pulses of the first pulse signal.

3. The method according to claim 1, wherein the input of the first data is triggered on select edges of a plurality of pulses of the first pulse signal.

4. The method according to claim 1, wherein the output of the second data is triggered on select edges of a plurality of pulses of the first pulse signal and on rising edges of a plurality of pulses of the second pulse signal.

5. The method according to claim 1, wherein the input of the second data is triggered on select edges of a plurality of pulses of the first pulse signal and on rising edges of a plurality of pulses of the second pulse signal.

6. The method according to claim 1, further comprising setting a mode of the memory device to an operational mode in which data is output from or input to the memory device at the first data rate.

7. The method according to claim 1, further comprising setting a mode of the memory device to an operational mode in which data is output from or input to the memory device at the second data rate.

8. The method according to claim 1, further comprising loading address information into the memory device on select edges of a plurality of pulses of a third pulse signal received from the external device.

9. The method according to claim 8, further comprising inhibiting at least one of the first read/write operations and the second read/write operations for a predefined period of time after the address information has been fully loaded into the memory device.

10. A memory device, comprising:
a storage device;
at least one memory controller coupled to the storage device and configured to
(a) receive a first pulse signal having a first pulse frequency from an external device,
(b) generate a second pulse signal using the first pulse signal, the second pulse signal being a compliment of the first pulse signal and having a second pulse frequency that is equal to the first frequency,
(c) control first read/write operations using the first pulse signal so that first data is output from or input to the storage device at a first data rate, and
(d) control second read/write operations using the first pulse signal and the second pulse signal so that second data is output from or input to the storage device at a second data rate that is twice the first data rate.

11. The memory device according to claim 10, wherein the output of the first data from the storage device is triggered only on select edges of a plurality of pulses of the first pulse signal.

12. The memory device according to claim 11, wherein the input of the first data to the storage device is triggered only on select edges of a plurality of pulses of the first pulse signal.

13. The memory device according to claim 11, wherein the output of the second data from the storage device is triggered on select edges of a plurality of pulses of the first pulse signal and on select edges of a plurality of pulses of the second pulse signal.

14. The memory device according to claim 11, wherein the input of the second data to the storage device is triggered on select edges of a plurality of pulses of the first pulse signal and on select edges of a plurality of pulses of the second pulse signal.

15. A memory device, comprising:
a unit cell array including a plurality of unit cells for storage of data, each unit cell configured to store one (1) bit of data;
an Input/Output buffer coupled to the unit cell array and configured to output first data read from the unit cell array to an external device and communicate second data to the unit cell array for storage therein;
at least one memory controller coupled to the Input/Output buffer and configured to
(a) receive a first pulse signal having a first pulse frequency from the external device,
(b) generate a second pulse signal using the first pulse signal, the second pulse signal being a compliment of the first pulse signal and having a second pulse frequency that is equal to the first frequency,
(c) control first read operations using the first pulse signal so that the first data is output from the Input/Output buffer at a first data rate,
(d) control first write operations using the first pulse signal so that the second data is input to the Input/Output buffer at a first data rate,
(e) control second read operations using the first pulse signal and the second pulse signal so that the first data is output from the Input/Output buffer at a second data rate that is twice the first data rate, and
(f) control second write operations using the first pulse signal and the second pulse signal so that the second data is input to the Input/Output buffer at the second data rate.

16. The memory device according to claim 15, wherein the output of the first data from the Input/Output buffer is triggered only on select edges of a plurality of pulses of the first pulse signal.

17. The memory device according to claim 15, wherein the input of the second data to the Input/Output buffer is triggered only on select edges of a plurality of pulses of the first pulse signal.

18. The memory device according to claim 15, wherein the output of the second data from the Input/Output buffer is triggered on select edges of a plurality of pulses of the first pulse signal and on select edges of a plurality of pulses of the second pulse signal.

19. The memory device according to claim 15, wherein the input of the second data to the Input/Output buffer is triggered on select edges of a plurality of pulses of the first pulse signal and on select edges of a plurality of pulses of the second pulse signal.

20. The memory device according to claim 15, wherein the memory controller is further configured to inhibit at least one of the first read/write operations and the second read/write operations for a predefined period of time after address information has been loaded into the memory device.

* * * * *